United States Patent [19]

Bardford

[11] Patent Number: 5,017,260
[45] Date of Patent: May 21, 1991

[54] ANTI-STATIC COATED PAPERBOARD OR SIMILAR RIGID MATERIAL

[75] Inventor: Judson A. Bardford, Holland, Mich.

[73] Assignee: Bradford Company, Holland, Mich.

[21] Appl. No.: 366,434

[22] Filed: Jun. 15, 1989

Related U.S. Application Data

[63] Continuation-in-part of Ser. No. 336,733, Apr. 12, 1989, which is a continuation-in-part of Ser. No. 190,044, May 4, 1988.

[51] Int. Cl.$^5$ .................. B65B 81/24; B65B 27/10; B65B 7/00
[52] U.S. Cl. .................. 156/308.2; 206/328; 156/273.3
[58] Field of Search .................. 206/328, 524.1, 205; 156/273.3, 272.2, 308.2

[56] References Cited

U.S. PATENT DOCUMENTS

| 4,154,344 | 5/1979 | Yenny, Jr. et al. | 206/328 |
|---|---|---|---|
| 4,156,751 | 5/1979 | Yenni, Jr. et al. | 206/332 |
| 4,293,070 | 10/1981 | Ohlbach | 206/328 |
| 4,424,900 | 1/1984 | Petcavich | 206/328 |
| 4,482,048 | 11/1984 | Blodgett | 206/328 |
| 4,496,406 | 1/1985 | Dedow | 206/328 |
| 4,528,222 | 7/1985 | Rzepecki et al. | 206/328 |
| 4,553,190 | 11/1985 | Mueller | 206/328 |
| 4,610,353 | 9/1986 | Young | 206/328 |
| 4,623,594 | 11/1986 | Keough | 428/413 |
| 4,647,714 | 3/1987 | Goto | 206/328 |
| 4,658,958 | 4/1987 | McNulty et al. | 206/328 |
| 4,677,809 | 7/1987 | Long et al. | 206/328 |
| 4,684,020 | 8/1987 | Ohlbach | 206/328 |
| 4,685,563 | 8/1987 | Cohen et al. | 206/328 |
| 4,699,830 | 10/1987 | White | 206/328 |
| 4,707,414 | 11/1987 | Long et al. | 206/328 |
| 4,711,702 | 12/1987 | Hood | 206/328 |
| 4,712,674 | 12/1987 | Young | 206/328 |
| 4,756,414 | 7/1988 | Mott | 206/328 |
| 4,767,003 | 8/1988 | Rice et al. | 206/328 |
| 4,773,534 | 9/1988 | DeHeras et al. | 206/328 |
| 4,792,042 | 12/1988 | Koehn et al. | 206/328 |

FOREIGN PATENT DOCUMENTS

| 0023159 | 2/1985 | Japan | 206/524.1 |
|---|---|---|---|
| 0071800 | 4/1985 | Japan | 206/524.1 |
| 0081400 | 5/1985 | Japan | 206/524.1 |
| 6241241 | 1/1987 | Japan | 206/328 |
| 2131382 | 6/1984 | England | 206/524.1 |
| 2516293 | 5/1983 | France | 206/328 |

Primary Examiner—Paul T. Sewell
Assistant Examiner—Jacob K. Ackun, Jr.
Attorney, Agent, or Firm—Wood, Herron & Evans

[57] ABSTRACT

A multiple-ply anti-static paperboard having a layer of relatively rigid material to which at least one ply of permanently anti-static/static-dissipative material is applied. Containers, as well as dividers and pads for containers, are made of such multiple-ply board materials. The permanently anti-static/static-dissipative layer prevents a static charge from being created when articles are inserted into or removed from the containers and prevents paperboard or other dust from contacting and adversely affecting the packaged article.

2 Claims, 1 Drawing Sheet

ANTI-STATIC COATED PAPERBOARD OR SIMILAR RIGID MATERIAL

This application is a continuation-in-part application of U.S. patent application Ser. No. 07/336,733, filed Apr. 12, 1989, which is in turn a continuation-in-part application of U.S. patent application Ser. No. 07/190,044 filed May 4, 1988, both of which applications are assigned to the assignee of this application.

This invention relates to relatively rigid multiple-ply anti-static packaging materials and, particularly, paperboard materials useful for packaging articles adversely affected by electrostatic discharge.

BACKGROUND OF THE INVENTION

Static discharge is a naturally occurring electronic phenomenon. Triboelectric charge, often referred to as static electricity, builds up in all materials to some degree, and is eventually discharged as the charge traverses a path toward an electrical ground. Static electricity buildup is strongest in insulative materials.

Circuit boards contain microcircuitry which can be easily damaged by electrostatic discharge of relatively small magnitude. Magnitudes as small as 50 volts can permanently damage these devices. For comparative purposes, to illustrate the extreme sensitivity of microcircuits to this phenomenon, a visible charge from a human hand to a door knob in winter will often exceed 10,000 volts. Thus, extreme caution must be taken in protecting such microcircuit components from electrostatic discharge.

To provide protection from electrostatic discharge for packaged articles, a principle of physics referred to as the Faraday cage effect is often employed. Electricity does not penetrate a conductive enclosure. The static electric charge will go around the enclosed space, seeking the path of least electrical resistance en route to ground. By surrounding a static sensitive article with a conductive enclosure, the article is shielded from electrostatic discharge originating outside of the enclosure.

In my co-pending U.S. patent application Ser. No. 07/336,733, I have disclosed a multiple-ply anti-static paperboard product for use in Faraday cage-type packaging of electrostatic charge sensitive articles, such as electrical components or electrical circuit boards. The multiple-ply paperboard product comprises a layer of high-carbon content paperboard sandwiched between two layers of anti-static (now defined a static-dissipative) material. Such multiple-ply paperboard is particularly useful in the manufacture of dividers, pads and walls of containers for packaging articles which are required to be shielded from exposure to static discharge.

The packaging material described in the above-identified application has been found to be very beneficial in the protection of articles against damage by static electricity, but in many instances, that material affords more protection against certain types of static electricity and less protection against other types of static electricity than is required for specific applications. Specifically, and as one example, many applications require only protection against static electricity generated internally of the package either by an electrical component or article rubbing against a portion of the package or by one portion of the package rubbing against another portion of the package. In applications of this type, there is no need for the electrical conductivity of the center ply of this multiple-ply anti-static material.

It has therefore been an objective of this invention to provide a multiple-ply package material which may be utilized in the manufacture of a container or portion of a container and which provides effective protection against damage to products or articles packaged in the container resulting from static electricity to which the package may be subjected.

One attempt at protecting static electricity sensitive articles against static electricity is disclosed in U.S. Pat. No. 4,658,985 to McNulty. This patent discloses a bag having two plies of anti-static (polyethylene) material and an electrically conductive fabric or mat embedded therebetween to provide a shield from electrostatic discharge for a bagged article. Because the bag is lined with an anti-static material, it affords protection against electrostatic charge generated internally of the package, but the bag does not, by itself, provide adequate rigidity for physical protection of a microcircuit component. In order to provide physical protection, the bagged article must be placed within another cell in a rigid container. This results in additional material and material handling costs requiring a bag enclosure, additional labor costs associated with bagging the component or article, and additional shipping costs due to reduced packaging density. Reduced packaging density is due to the fact that each cell of a container which must hold an article within a bag, rather than just the article itself, occupies more space than the article alone. Thus, for a container having a given volume, use of bag packaging necessitates larger size cells, resulting in the packaging of fewer articles per container.

Another technique for protecting static electricity sensitive articles against static electricity is disclosed in U.S. Pat. No. 4,623,594 to Keough. This patent discloses that a mixture of prepolymer and anti-static agent may be applied to a substrate, such as polypropylene fiber or paper or glass, and then cured to set the anti-static agent by contacting the mixture with electron beam radiation. Because the mixture is cured in situ, after application to the substrate, this technique is very limited in its application and, to date, has only been applied commercially to bag materials. Consequently, for physical protection, articles protected against static electricity by material treated in accordance with the disclosure of this patent must be enclosed within a bag, and that bag, if it is to be physically protected, must be packaged in another rigid container. This again results in additional material and material handling costs, as well as reduced packaging density.

Heretofore, anti-static materials have also been applied to a cardboard substrate, but that cardboard substrate-applied anti-static material, usually low-density polyethylene, has been rendered anti-static by being doped with a chemical anti-static additive, generally some form of amine. Unfortunately, amines have several undesirable characteristics when used to impart anti-static properties to packaging materials. First of all, amines do not render the material to which they are added permanently anti-static. Rather, that anti-static coating of material loses its anti-static property over a period of time. Otherwise expressed, that amine-doped material has a relatively short shelf life because the amines, trapped within the plastic, evaporate or gassify with time from the plastic or other material within which the amine is trapped such that the plastic loses its anti-static property. Secondly, the amine is very corrosive to many metals, including the metals from which many microcircuits are manufactured. Consequently, the amine, gassifying from the anti-static plastic, can, and often does, corrode and impair the electrical transmission characteristics of the component which the anti-static material is intended to protect. Additionally, the amines which escape from the anti-static plastic can, and often do, attack the polycarbonate boards upon which many microcircuits are applied. In the course of attacking the polycarbonate, the amine causes stress cracks, and ultimately failure of the board. Additionally, the amines contained in the anti-static plastic are humidity dependent, meaning that the atmosphere within which the amine-doped plastic is intended to afford protection to articles contained in a package of the amine-containing anti-static material must be used in an atmosphere having a certain minimum humidity level. In some atmospheres, such as those which are very dry as in dry areas of the United States, amine-containing anti-static plastic materials have no anti-static property.

It has therefore been one objective of this invention to provide a relatively rigid anti-static multiple-ply packaging material which contains no amines and which is permanently anti-static.

SUMMARY OF THE INVENTION

The invention of this application which accomplishes this objective comprises a relatively rigid ply of paperboard or like material to which at least one ply of permanently anti-static/static-dissipative plastic material, which material has been previously rendered anti-static, is applied. In the preferred embodiment, that permanently anti-static/static-dissipative plastic material is laminated onto the paperboard via an intermediate ply of low-density polyethylene. The anti-static plastic material is amine free, and, in the presently preferred embodiment, it comprises a low-density polyethylene film which has been chemically coated and subjected to high-energy electron beam radiation. One such suitable amine-free coating material is identified as "Staticure" manufactured by MPI Metallized Products, Inc. of Winchester, Massachusetts.

The preferred anti-static/static-dissipative material is a low-density polyethylene film which has been subjected to high-energy, electron beam radiation in the manner described in U.S. Pat. No. 4,623,594. This precast anti-static plastic film, which has been previously exposed to electron beam radiation to permanently set the anti-static material, is preferably laminated onto both sides of an untreated conductive paperboard by layering the precast film over the paperboard while the paperboard is coated with a thin coating of molten polyethylene. Upon solidification of the molten polyethylene, the precast film is permanently laminated to the paperboard.

In forming the outer layers for all embodiments described hereinabove, a corrosion inhibitor may be added to protect the packaged article from chemical corrosion. To provide chemical protection, the added corrosion inhibitor evaporates off of the outer ply and attaches itself to the packaged article, thereby shielding the article from the sulfuric compounds.

These and other objects and advantages of the invention will become more apparent from the following detailed description of the invention in which:

DETAILED DESCRIPTION OF THE INVENTION

Many of the terms used throughout this application have recently been redefined by the American National Standard Institute in their new Packaging Material Standards for ESD Sensitive Items E1A-541, published in June of 1988. In these new standards, packaging materials are defined as being in the "conductive" range if they have a measurable surface resistivity of less than $10^4$ ohms per square. Until the standards were changed in June, 1988, "conductive materials" were defined as those having measurable surface resistivity of less than $10^5$ ohms per square. Similarly, the new standard, ANSI/EIA-541-1988, defines "Static-Dissipative materials" (formerly known as static-dissipative or anti-static materials) as those having a surface resistivity greater than $10^5$ ohms/square, but less than $10^{12}$ ohms/square. And, these same standards now define "Insulative materials" as those having surface resistivity equal to or greater than $10^{12}$ ohms/square. "Anti-static materials" are now defined by these new standards as those materials which minimize electrostatic charge when rubbed against or separated from themselves or other similar materials. For purposes of this application, and when used in this application, the terms "anti-static," "static-dissipative," "conductive" and "insulative" shall be used as defined in the new definitions contained in ANSI/EIA-514-1988.

Figure 1:
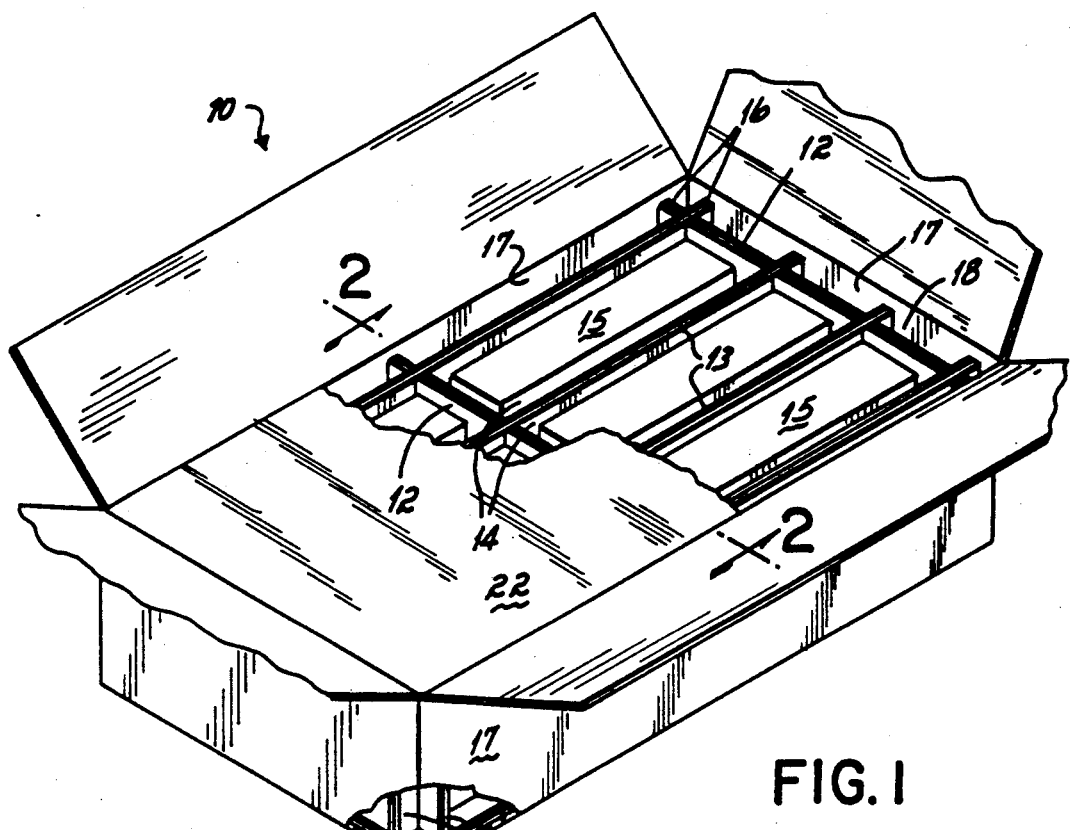
FIG. 1 is a perspective view of a corrugated container, with a plurality of packaging cells partially defined therein by transverse and longitudinal dividers of the multiple-ply anti-static paperboard of this invention.

With reference first to FIG. 1, there is illustrated a container 10 embodying the invention of this application. This container 10 is fitted therein with transverse dividers or partitions 12 and longitudinal dividers or partitions 13 which define the side walls of a plurality of cells 14. Each cell 14 is designed to hold an article 15 to be shipped. Both the transverse dividers 12 and the longitudinal dividers 13 have some excess portion 16 which extends beyond an adjacent cell 14 and into contact with side panels 17 of the container 10, thereby defining a plurality of voids 18 or empty spaces which remain unused. As known in the container industry, the transverse dividers 12 have vertically, downwardly extending slits, and the longitudinal dividers 13 have corresponding vertically, upwardly extending slits, to enable interfitting of the dividers within the container 10 to partially define the cells 14. Alternately, the vertical slits in the transverse divider 12 may be upwardly extending and the vertical slits in the longitudinal dividers 13 may extend downwardly.

Figure 2:
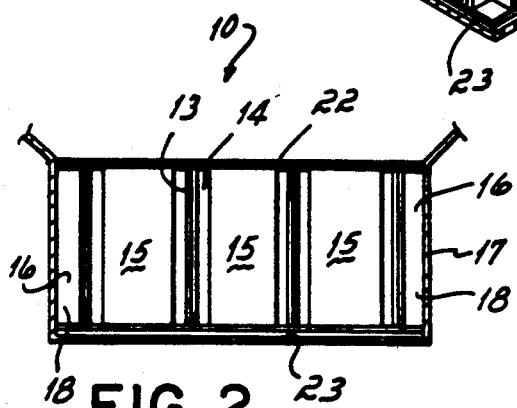
FIG. 2 is a cross-sectional view taken on lines 2—2 of FIG. 1.

As shown in FIG. 2, a lower pad 23 resides beneath the dividers, and an upper pad 22 overlays the dividers to completely enclose the cells 14. According to the invention, the transverse dividers 12, the longitudinal dividers 13, and the top 22 and bottom 23 pads are comprised of a multiple-ply anti-static paperboard 25, which is shown in FIG. 3.

Figure 3:
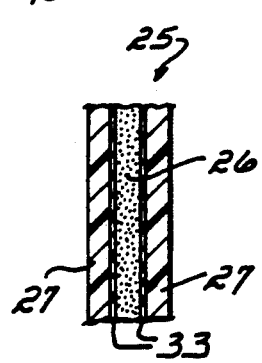
FIG. 3 is a cross-sectional view of the preferred embodiment of a multiple-ply anti-static paperboard of this invention.

The multiple-ply anti-static paperboard 25 comprises a layer of insulative paperboard or fiberboard 26 which is preferably sandwiched between two layers of low-density, anti-static polyethylene 27, as shown in FIG. 3. The interior paperboard ply 26 is electrically insulative, having a surface resistivity equal to or greater than $10^{12}$ ohms per square.

The preferred insulative inner layer 26 is a relatively rigid ply of paperboard formed by a conventional paper making slurry process to create a fiberboard or paperboard sheet having a surface resistivity equal to or greater than $10^{12}$ ohms per square. The insulative property of the paperboard is not critical to the practice of this invention. It is only critical that the inner layer 26 be relatively rigid such that it may be self-standing and provide physical protection to articles contained in the cells of the container.

A preferred embodiment of the multiple-ply anti-static paperboard 25 is illustrated in FIG. 3. In this embodiment, precast, permanently anti-static/static-dissipative plastic layers 27 are laminated onto the opposite sides of the conductive paperboard 26. The preferred precast, permanently anti-static/static-dissipative plastic layers 27 are layers of low-density, polyethylene film which have been coated and subjected to high-energy, electron-beam radiation so as to render the film permanently anti-static and permanently static dissipative. A complete description of the process for manufacturing such a polyethylene film may be found in U.S. Pat. No. 4,623,594. This polyethylene film is characterized by a surface resistivity of more than $10^5$ but less than $10^{12}$ ohms per square. One preferred precast, polyethylene film having this permanent anti-static/static-dissipative surface resistivity is manufactured by MPI Metallized Products, Inc. of Winchester, Massachusetts and is identified by that company as its "Staticure" product. This "Staticure+" product is particularly advantageous for use in this application because it is a permanently anti-static and static dissipative, i.e., it does not lose its anti-static and static-dissipative qualities or change its surface resistivity over prolonged periods of time.

Figure 4:
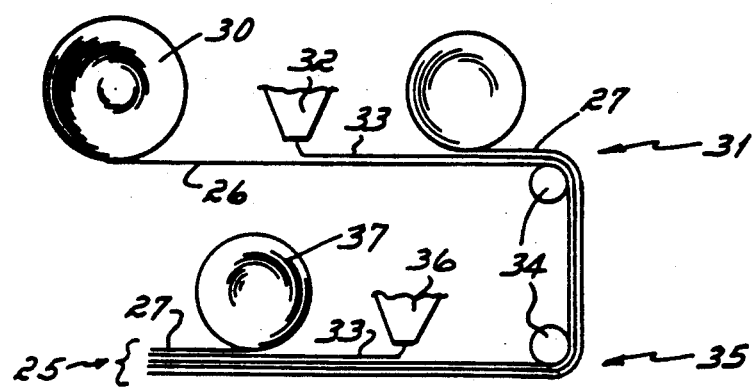
FIG. 4 is a diagrammatic illustration of a method of forming the paperboard of FIG. 3.

With reference to FIG. 4, there is illustrated schematically the manner in which the paperboard product 25 of FIG. 3 is manufactured. As there illustrated, a roll 30 of paperboard 26 is unwound at a first level 31. The paperboard 26 may be electrically conductive, high-carbon content paperboard or it may alternatively be non-conductive or insulative paperboard. At a first extruding station 32, a thin film 33 of low-density, molten, polyethylene is extruded onto the top side of the paperboard 26. Before the polyethylene film solidifies, a first ply of the precast permanently anti-static/static-dissipative plastic film 27 is unwound from a roll 34 and applied over the top surface of the molten polyethylene film 33. Rollers 34 then direct the paperboard 26, having one ply of precast anti-static plastic film 27 applied thereto, to a second level 35. As the paperboard 26 moves along the second level 35, the paperboard 26 passes beneath a second extruding station 56 at which a second thin film 33 of molten, low-density polyethylene is applied to the now top surface (formerly the undersurface) of the paperboard 26. While this second film 33 of molten polyethylene is still in the molten state, a second ply 27 of precast permanently anti-static/static-dissipative plastic film is unrolled from a roll 37 onto the top surface of the molten polyethylene film 33. When the polyethylene films 33 are solidified, they permanently secure the top and bottom plies or laminates 27 to the paperboard 26 which is now sandwiched therebetween. The multiple-ply, anti-static paperboard 25 is now ready to be cut for use.

Thus, according to one preferred embodiment of the invention, a layer of paperboard 26 or other relatively rigid ply of material is sandwiched by layers of permanently anti-static/static-dissipative material. The anti-static layer adjacent the article prevents sloughing or abrading of the paperboard material onto articles packaged in the material, which could cause circuit damage. It also prevents generation of static electricity resulting from relative movement of the protected articles and the packaging paperboard.

The multiple-ply anti-static/static-dissipative paperboard also provides sufficient rigidity to physically protect packaged articles. This physical protection is achieved with a savings in material and labor, as compared to packaging requiring a bag.

The multiple-ply anti-static/static-dissipative paperboard of this invention has the advantage of being permanently anti-static and of permanently maintaining its static-dissipative quality. Otherwise expressed, the invention of this application, because of this permanence, has no shelf life. Heretofore, all anti-static and/or static-dissipative coatings or materials have been produced by doping polypropylene or other plastic materials with an amine so as to impart the anti-static property to the polypropylene plastic. That amine, though, was solely dissipated or gassified from the polypropylene plastic over a period of time with the result that the polypropylene plastic lost its anti-static property over a period of time. Consequently, such material had a limited shelf life.

Because the multiple-ply anti-static/static-dissipative paperboard of this invention is amine free, the material does not cause amine corrosion of metal packaged within such amine-free material. Additionally, many printed electrical circuits are imprinted on polycarbonate plastic, which plastic is subject to stress cracking when subjected or exposed to amines. The invention of this application, because it contains no amines, does not have this adverse effect upon polycarbonate boards. Anti-static plastics which contain amines are also humidity sensitive, i.e., they are only operative and only maintain their anti-static properties so long as there is some minimal humidity level maintained in the atmosphere. The amine-containing anti-static plastics therefore are not operative in very dry atmospheres to which such anti-static materials are often exposed. The invention of this application is not humidity dependent.

The multiple-ply anti-static paperboard of this invention may be made to provide chemical protection for packaged articles. For example, a corrosion inhibitor commonly referred to as Cobra Tech, manufactured by PMC Specialty and formerly made by Sherwin Williams, may be mixed into the outer layers 27 prior to application of these outer layers to the interior layer 26 in order to protect copper or copper alloyed articles. This substance dissipates off the outer layer to attach itself to the copper or copper alloy, thereby shielding the article from sulfuric compounds in the paper. Similarly, other corrosion inhibitors could be used with other types of articles, depending upon the metal that is required to be protected. Because the low-density anti-static/static-dissipative polyethylene layers of the preferred embodiment are chemically inert, they will physically shield the packaged article from chemical corrosion. Thus, the addition of a corrosion inhibitor for this embodiment would not be necessary, but would provide added protection against chemical corrosion.

Figure 5:
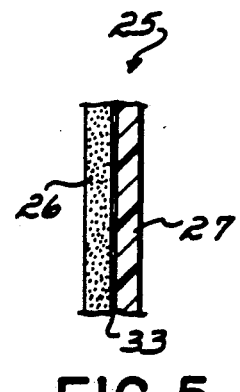
FIG. 5 is a cross-sectional view of an alternative embodiment of the multiple-ply anti-static paperboard of this invention.

While I have heretofore described one preferred embodiment of the multiple-ply anti-static/static-dissipative material of this invention as embodying a single ply of paperboard or other relatively rigid material sandwiched between two plies of anti-static/static-dissipative material, the invention of this application contemplates that such multiple-ply material may comprise only a single ply or coating 27 on one side of the base material 26 as illustrated in FIG. 5. Such a multiple-ply product is particularly useful in many packaging applications wherein only a single side of the material may be exposed to electrical components or static-sensitive articles. One such application for single-side coated, multiple-ply anti-static/static-dissipative material is in the production of corrugated paperboard material used in the manufacture of boxes or containers within which static-sensitive electrical components or articles may be packaged. When used to produce permanently anti-static/static-dissipative corrugated paperboard, the base ply of paperboard is first laminated or coated with a single ply of anti-static/static-dissipative material, and then that coated or laminated material is subjected to a corrugating process in which it is converted into corrugated paperboard.

As yet another alternative to the practice of this invention, the base ply of material 26, rather than being electrically insulative paperboard, may be a relatively rigid sheet of extruded plastic material to which the coating or ply of anti-static/static-dissipative material may be applied.

In the description of this invention, the preferred practice of this invention has been described as having the exterior ply of anti-static/ static-dissipative material laminated to the base ply of paperboard or other material. It is contemplated, though, that exterior ply may be applied to the base ply 26 by extrusion of the permanently anti-static/static-dissipative material onto the base ply.

The preferred embodiment of the invention described hereinabove employs "Staticure," a polyethylene material which has been chemically coated and subjected to high energy electron beam radiation as the anti-static/static-dissipative material in the multiple-ply product. The process by which such "Staticure" material is created is completely described in U.S. Pat. No. 4,623,594 issued Nov. 18, 1986 to MPI Metallized Products, Inc. This material has been found to be very satisfactory in the practice of this invention. It is contemplated, though, that such polyethylene material prior to being treated so as to render it anti-static/static-dissipative may have compounded therein conventional materials to render the polyethylene material biodegradable either by chemical breakdown of the material or by ultraviolet light breakdown.

It is also contemplated, and within the scope of this invention, that in lieu of polyethylene film material being utilized in the practice of this invention as the permanently anti-static/static-dissipative material, polyethylene foam may be treated and used as the permanently anti-static/static-dissipative ply of material. The polyethylene foam would otherwise be treated the same as the film in order to impart to the foam the permanent anti-static/static-dissipative quality. After formation of the foam and anti-static agent and treatment by exposure to electron beam radiation to render the foam permanently anti-static/static-dissipative, the foam would be adhered to the paperboard or other relatively rigid substrate in exactly the same manner that the polyethylene film is described hereinabove as being laminated to the paperboard or other substrate. The advantage of the foam-coated product is, of course, that it provides additional physical protection of any products packaged with the multiple-ply foam-coated product.

While I have described only a limited number of embodiments of the multiple-ply anti-static paperboard of this invention, it is to be understood that the invention is not to be limited solely to these embodiments. Various other alternative embodiments will be readily apparent to persons skilled in this art. Accordingly, it is to be understood that changes may be made without departing from the scope of the invention as particularly set forth and described.

I claim:

1. A method of forming a multiple-ply anti-static material comprising the steps of:

forming a relatively rigid ply of material, said ply having first and second surfaces;

forming a layer of precast, amine-free permanently anti-static/static-dissipative plastic which has been subjected to high-energy, electron-beam radiation, applying a layer of molten adhesive to at least one surface of said rigid ply of material or said plastic, and laminating said layer of plastic onto at least one of said first and second surfaces of said rigid ply of material while said adhesive is in a molten state so that said layer of plastic is secured to said at least one surface by said adhesive after cooling of said adhesive, said layer of plastic having been rendered permanently anti-static/static-dissipative prior to lamination to said one of said first and second surfaces, said anti-static plastic having a surface resistivity of greater than $10^5$ but less than $10^{12}$ ohms per square.

2. A method of forming a multiple-ply anti-static material comprising the steps of:

forming a relatively rigid ply of material, said ply having first and second surfaces, forming a layer of amine free permanently anti-static/static-dissipative plastic, applying a layer of molten adhesive to at least one surface of said rigid ply of material or said plastic, laminating said layer of plastic onto at least one of said first and second surfaces of said rigid ply of material while said adhesive is in a molten state so that said layer of plastic is secured to said at least one surface by said adhesive after cooling of said adhesive, and said layer of plastic having been rendered permanently anti-static/static-dissipative prior to application to said one of said first and second surfaces, said anti-static plastic having a surface resistivity of greater than $10^5$ but less than $10^{12}$ ohms per square.

* * * * *

UNITED STATES PATENT AND TRADEMARK OFFICE
CERTIFICATE OF CORRECTION

PATENT NO. : 5,017,260

DATED : May 21, 1991

INVENTOR(S) : Judson A. Bradford

It is certified that error appears in the above-identified patent and that said Letters Patent is hereby corrected as shown below:

On title page, item [19] "Bardford" should be --Bradford-- item [75] Inventor: "Bardford" should be --Bradford--

Signed and Sealed this

Twenty-sixth Day of October, 1993

*Attest:*

BRUCE LEHMAN

*Attesting Officer*   Commissioner of Patents and Trademarks